United States Patent
Lee et al.

(10) Patent No.: US 11,094,773 B2
(45) Date of Patent: Aug. 17, 2021

(54) DISPLAY DEVICE

(71) Applicant: SAMSUNG DISPLAY CO., LTD., Yongin-si (KR)

(72) Inventors: Donghyun Lee, Yongin-si (KR); Sanghun Oh, Yongin-si (KR); Keunsoo Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 44 days.

(21) Appl. No.: 16/165,514

(22) Filed: Oct. 19, 2018

(65) Prior Publication Data
US 2019/0296099 A1 Sep. 26, 2019

(30) Foreign Application Priority Data

Mar. 26, 2018 (KR) .................. 10-2018-0034754

(51) Int. Cl.
*H01L 27/32* (2006.01)
*H01L 51/52* (2006.01)

(52) U.S. Cl.
CPC ...... *H01L 27/3279* (2013.01); *H01L 27/3246* (2013.01); *H01L 27/3258* (2013.01); *H01L 51/5253* (2013.01); *H01L 27/322* (2013.01); *H01L 51/5281* (2013.01); *H01L 51/5284* (2013.01)

(58) Field of Classification Search
CPC ............. H01L 27/3246; H01L 27/3279; H01L 27/3276; H01L 27/3258; H01L 27/322; H01L 51/5253; H01L 51/5281; H01L 51/5284
See application file for complete search history.

(56) References Cited

U.S. PATENT DOCUMENTS

| | | | |
|---|---|---|---|
| 9,716,248 B2 | 7/2017 | Visweswaran et al. | |
| 9,859,334 B2 | 1/2018 | Kim et al. | |
| 9,954,200 B2 | 4/2018 | Kim et al. | |
| 2014/0022478 A1* | 1/2014 | Kim ................. | G02F 1/1339 349/43 |
| 2016/0365398 A1* | 12/2016 | Kim ................. | H01L 27/3276 |

(Continued)

FOREIGN PATENT DOCUMENTS

| KR | 10-2017-0015629 A | 2/2017 |
|---|---|---|
| KR | 10-2017-0113932 A | 10/2017 |
| KR | 10-2017-0134903 A | 12/2017 |

*Primary Examiner* — Vongsavanh Sengdara
(74) *Attorney, Agent, or Firm* — Kile Park Reed & Houtteman PLLC

(57) ABSTRACT

Provided is a display device including a substrate including a display area and a non-display area; a thin-film transistor and a display element on the display area; an organic insulating layer between the thin-film transistor and the display element; a first power supply voltage line arranged to correspond to one side of the display area in the non-display area; a second power supply voltage line spaced apart from the first power supply voltage line; and an inorganic protective layer that covers at least a portion of the second power supply voltage line. The second power supply voltage line includes a first region and a second region. The first region has a stack of a first conductive layer, a second conductive layer, and the organic insulating layer. The second region has a stack of the first conductive layer and the inorganic protective layer.

20 Claims, 10 Drawing Sheets

(56) References Cited

U.S. PATENT DOCUMENTS

2017/0033312 A1\* 2/2017 Kim .................... H01L 27/3276
2017/0287994 A1 10/2017 Senda et al.
2017/0345847 A1\* 11/2017 Kim .................... H01L 27/3244
2017/0365814 A1\* 12/2017 Kim .................... H01L 51/5246

\* cited by examiner

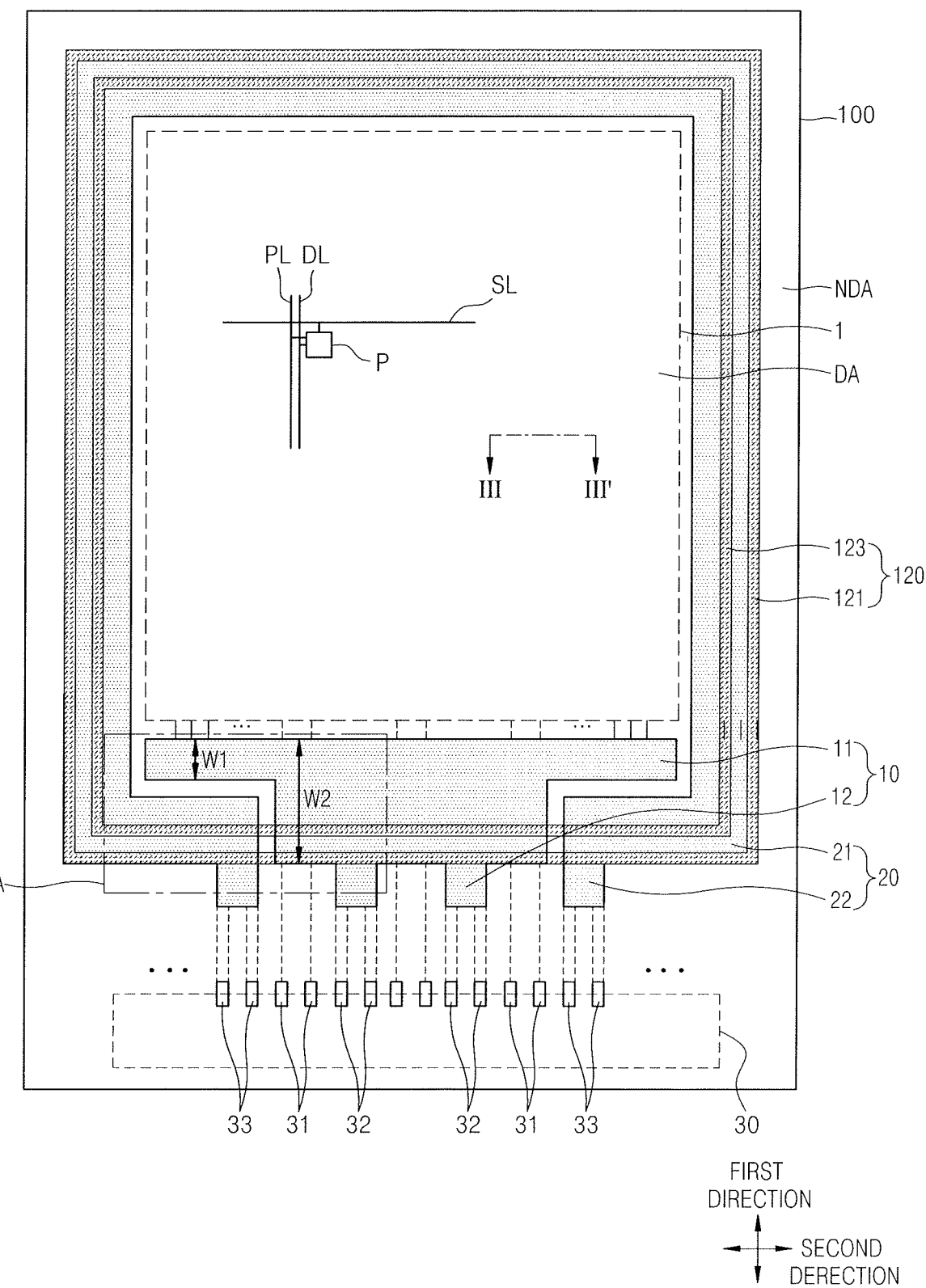

DISPLAY DEVICE

CROSS-REFERENCE TO RELATED APPLICATION

Korean Patent Application No. 10-2018-0034754, filed on Mar. 26, 2018, in the Korean Intellectual Property Office, and entitled: "Display Device," is incorporated by reference herein in its entirety.

BACKGROUND

1. Field

One or more embodiments relate to a display device, and more particularly, to a display device capable of reducing the area of a non-display area of the display device and having high quality.

2. Description of the Related Art

Display device may include a substrate partitioned into a display area and a non-display area. The display area includes a gate line and a data line, insulated from each other, which intersect to define a plurality of pixel areas in the display area. Furthermore, each of the pixel areas includes a thin-film transistor and a pixel electrode electrically connected to the thin-film transistor. Also, the display area includes an opposite electrode commonly provided in the pixel areas. The non-display area may include various wirings for transmitting electrical signals to the display area, e.g., a gate driver, a data driver, a controller, and the like. There are a variety of designs that increase the ratio of a display area that provides an image and decrease a non-display area in which no image is displayed.

SUMMARY

According to one or more embodiments, a display device includes: a substrate including a display area to display an image and a non-display area outside the display area; a thin-film transistor on the display area, and a display element electrically connected to the thin-film transistor; an organic insulating layer between the thin-film transistor and the display element in the display area and extending to a portion of the non-display area; a first power supply voltage line arranged to correspond to one side of the display area in the non-display area; a second power supply voltage line spaced apart from the first power supply voltage line in the non-display area; and an inorganic protective layer that covers at least a portion of the second power supply voltage line. The second power supply voltage line includes a first region and a second region. The first region has a stack of a first conductive layer, a second conductive layer, and the organic insulating layer. The second region has a stack of the first conductive layer and the inorganic protective layer.

The display device may further include a data line and a driving voltage line which are arranged in the display area, electrically connected to the thin-film transistor, and provided in different layers, wherein the display element may include a pixel electrode, an opposite electrode facing the pixel electrode, and an intermediate layer between the pixel electrode and the opposite electrode. The first conductive layer may include the same material as the data line, the second conductive layer may include the same material as the driving voltage line, and the organic insulating layer may be between the driving voltage line and the pixel electrode.

The display device may further include a pixel defining layer that covers an edge of the pixel electrode in the display area, wherein the pixel defining layer may overlap the first region in the non-display area.

The first power supply voltage line may include a third region and a fourth region, wherein the third region may be covered with the organic insulating layer, and the fourth region may be covered with the inorganic protective layer.

One side of the first region may substantially may coincide with an extension line of one side of the third region.

The first power supply voltage line may include an end portion having a first width and a central portion having a second width greater than the first width, and the second power supply voltage line may bend to surround the end portion of the first power supply voltage line.

The display device may further include a pad portion corresponding to one edge of the substrate, and the first region of the second power supply voltage line is arranged between the display area and the pad portion.

The second conductive layer may cover a side surface of at least one end of the first conductive layer.

The display device may further include: a thin-film encapsulation layer on the display area; and a dam portion on the non-display area and surrounding at least a portion of the display area, and at least a portion of the dam portion may be on the second power supply voltage line.

The dam portion may be spaced apart from the organic insulating layer.

The inorganic protective layer may be between the second power supply voltage line and the dam portion.

The dam portion may include a first dam and a second dam spaced from each other, and the first dam may cover an edge of the second power supply voltage line, and the second dam may be closer to the display area than the first dam.

At least one of the first dam and the second dam may be include a plurality of layers.

According to one or more embodiments, a display device includes: a substrate including a display area displaying an image and a non-display area outside the display area; a thin-film transistor on the display area, and a display element electrically connected to the thin-film transistor; an organic insulating layer between the thin-film transistor and the display element in the display area and extending to a portion of the non-display area; a pad portion on one side of the substrate in the non-display area; a power supply voltage line between the display area and the pad portion; and an inorganic protective layer that covers at least a portion of the power supply voltage line, wherein the power supply voltage line includes a first region and a second region, wherein the first region has a stack of a first conductive layer, a second conductive layer, and the organic insulating layer, and the second region has a stack of the first conductive layer and the inorganic protective layer.

The display device may further include a data line and a driving voltage line which are electrically connected to the thin-film transistor and provided in different layers, and the first conductive layer may include the same material as the data line and the second conductive layer may include the same material as the driving voltage line, the organic insulating layer may be on the driving voltage line, and a via layer may be between the data line and the driving voltage line.

The display device may further include a pixel electrode, an opposite electrode facing the pixel electrode, and an intermediate layer between the pixel electrode and the opposite electrode, and a pixel defining layer that covers an edge of the pixel electrode in the display area, wherein the pixel defining layer may overlap to the first region in the non-display area.

The display device may further include a thin-film encapsulation layer on the display area; and a dam portion arranged on the non-display area and surrounding at least a portion of the display area, and at least a portion of the dam portion may be on the power supply voltage line.

The thin-film encapsulation layer may include a first inorganic encapsulation layer, an organic encapsulation layer, and a second inorganic encapsulation layer, wherein the organic encapsulation layer may be inside the dam portion, and the first inorganic encapsulation layer and the second inorganic encapsulation layer may be in contact with each other outside the dam portion.

The dam portion may be spaced apart from the organic insulating layer.

The inorganic protective layer may be arranged between the dam portion and the power supply voltage line.

BRIEF DESCRIPTION OF THE DRAWINGS

Features will become apparent to those of skill in the art by describing in detail exemplary embodiments with reference to the attached drawings in which:

FIG. 1 illustrates a plan view of a display device according to an embodiment;

DETAILED DESCRIPTION

Figure 2A:
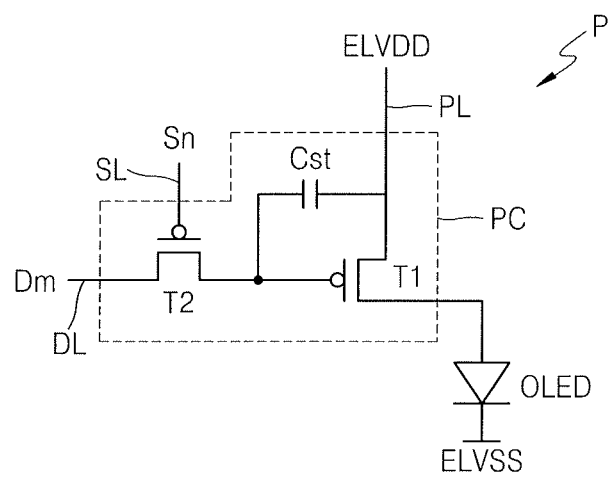
FIGS. 2A and 2B illustrate equivalent circuit diagrams of any one pixel in a display device according to an embodiment.

Since the disclosure may have diverse modified embodiments, preferred embodiments are illustrated in the drawings and are described in the detailed description. Advantages and features of the embodiments, and implementation methods thereof will be clarified through following embodiments described with reference to the accompanying drawings. In this regard, an embodiment of the disclosure may have different forms and should not be construed as being limited to the descriptions set forth herein.

Reference will now be made in detail to embodiments, examples of which are illustrated in the accompanying drawings, wherein like reference numerals refer to like elements throughout, and repeated description thereof will be omitted.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context. It will be further understood that the terms "comprises" and/or "comprising" used herein specify the presence of stated features or components, but do not preclude the presence or addition of one or more other features or components. Sizes of components in the drawings may be exaggerated for convenience of explanation. In other words, since sizes and thicknesses of components in the drawings are arbitrarily illustrated for convenience of explanation, the following embodiments are not limited thereto.

It will be understood that when a layer, region, or component is connected to another portion, the layer, region, or component may be directly connected to the portion or an intervening layer, region, or component may exist. For example, when a layer, region, or component is electrically connected to another portion, the layer, region, or component may be directly electrically connected to the portion or may be indirectly connected to the portion through another layer, region, or component.

Display devices may be used to display images, texts, etc. and may be classified into liquid crystal displays, electrophoretic displays, organic light-emitting displays, inorganic light-emitting displays, field emission displays, surface-conduction electron-emitter displays, plasma displays, and cathode ray displays. Hereinafter, an organic light-emitting display will be described as a display device according to an embodiment, but a display device according to an embodiment is not limited thereto and various kinds of display devices may be used.

FIG. 1 is a plan view of a display device according to an embodiment. Referring to FIG. 1, the display device includes a display 1 on a substrate 100. The display 1 includes a data line DL extending in a first direction and pixels P connected to a scan line SL extending in a second direction intersecting the first direction. Each pixel P is also connected to a driving voltage line PL extending in the first direction.

Each pixel P emits, e.g., red, green, blue, or white light, and may include, e.g., an organic light-emitting device. Each pixel P may further include elements, e.g., as a thin-film transistor (TFT), a capacitor, and the like. The display 1 provides a predetermined image from light emitted from the pixels P, and defines a display area DA. The pixel P in this specification refers to a sub-pixel which emits red, green, blue or white light, as described above, although other color codes for producing white light may be used.

A non-display area NDA is outside the display area DA. For example, the non-display area NDA may surround, e.g., completely surround, the display area DA. The non-display area NDA is an area in which the pixels P are not arranged, and does not display an image. The non-display area NDA may include a first power supply voltage line 10 and a second power supply voltage line 20 to which different power supply voltages are applied.

The first power supply voltage line 10 may include a first main voltage line 11 and a first connection line 12 on a first side of the display area DA. For example, when the display area DA is rectangular, the first main voltage line 11 may be arranged to correspond to any side of the display area DA. The first main voltage line 11 may have end portions having a first width W1 in a first direction and a central a second width W2 in the first direction greater than the first width W1. Here, the first direction may be understood as a direction from the display area DA to a pad portion 30. The end portions of the first main voltage line 11 may extend from the central portion in opposite second directions, while the central portion of the first main voltage line 11 is closer to the pad portion 30 than the end portions thereof.

The first connection line 12 extends from the first main voltage line 11 in the first direction. The first connection line 12 may be connected to a first pad 32 of the pad portion 30. The first connection line 12 may have a narrower width on the second direction, crossing the first direction, than the central portion of the first main voltage line, and may be proceed in plural.

The second power supply voltage line 20 may include a second main voltage line 21, partially surrounding both end portions of the first main voltage line 11 and the display area DA, and a second connection line 22 extending from the second main voltage line 21 in the first direction. For example, when the display area DA is a rectangle, the second main voltage line 21 may extend along the both end portions of the first main voltage line 11 and the remaining sides except the first side of the display area DA adjacent to the first main voltage line 11. The second connection line 22 extends in the first direction parallel to the first connection line 12 and is connected to the pad portion 30, e.g., a second pad 33. The second power supply voltage line 20 may be bent to surround ends of the first power supply voltage line 10.

Both end portions of the first power supply voltage line 10 have a width W1 less than a width W2 of a central portion of the first power supply voltage line 10 so that the second power supply voltage line 20 may not occupy much space along the first direction in surrounding the both end portions of the first power supply voltage line 10. For example, the second main voltage line 21 may be between end portions of the first power supply voltage line 10 and the pad portion and may be spaced from the pad portion 30 by a same distance along the first direction as the central portion of the first power supply voltage line 10. In other words, sides of the first and second main voltage lines 11 and 21 furthest from the display area DA may substantially coincide. In addition, since the central portion of the first power supply voltage line 10 has a relatively large width W2, the overall resistance of the first power supply voltage line 10 may be small.

The pad portion 30 is at the first end of the substrate 100 and includes a plurality of terminals 31, 32, and 33. The pad portion 30 may be exposed, e.g., not covered by an insulating layer, and may be electrically connected to a controller, e.g., a flexible printed circuit board, a driving driver IC chip, and the like. The controller changes a plurality of image signals transmitted from the outside into a plurality of image data signals and transmits the image data signals to the display area DA through the terminal 31. Furthermore, the controller may receive signals, e.g., a vertical synchronization signal, a horizontal synchronization signal, a clock signal, and the like, to generate control signals for controlling driving of first and second gate drivers and transmit the control signals to each of the first and second gate drivers. The controller may transmit different voltages to the first power supply voltage line 10 and the second power supply voltage line 20 through the terminals 32 and 33.

The first power supply voltage line 10 may provide a first power supply voltage ELVDD to each pixel P and the second power supply voltage line 20 may provide a second power supply voltage ELVSS to each pixel P. For example, the first power supply voltage ELVDD may be provided to each pixel P through the driving voltage line PL connected to the first power supply voltage line 10. The second power supply voltage ELVSS may be provided to a cathode of an organic light-emitting device in each pixel P by the second power supply voltage line 20. Additionally, a scan driver for providing a scan signal to the scan line SL of each pixel P and a data driver for providing a data signal to the data line DL may be arranged in the non-display area NDA.

A dam portion 120 may be in the non-display area NDA. The dam portion 120 may include, e.g., first and second dams 121 and 123. FIG. 1 shows a structure in which two dams, for example, the first and second dams 121 and 123, are arranged. When an organic encapsulation layer 420 (of FIG. 4) of a thin-film encapsulation layer 400 is formed, the dam portion 120 may prevent an organic material from flowing in an edge direction of the substrate 100 to prevent an edge tail of the organic encapsulation layer 420 from being formed. The dam portion 120 on the non-display area NDA may be arranged to surround at least a portion of the display area DA, e.g., may completely surround the display area DA. The first dam 121 and the second dam 123 may be spaced apart from each other when a plurality of dams such as the first dam 121 and the second dam 123 are provided, wherein the first dam 121 may surround at least a portion of the second dam 123, e.g., may completely surround the second dam 123.

The first and second dams 121 and 123 may be formed to have a width that is less than a width of a power supply voltage line, e.g., a width of the second power supply voltage line 20. In some embodiments, the first dam 121 may overlap an edge of a power supply voltage line, e.g., the second main voltage line 21 of the second power supply voltage line 20. In another embodiment, the second dam 123 has a width that is less than a width of a power supply voltage line, for example, the width of the second power supply voltage line 20. In the specification, it is understood that the power supply voltage line refers to one or both of the first power supply voltage line 10 and the second power supply voltage line 20.

Figure 2B:
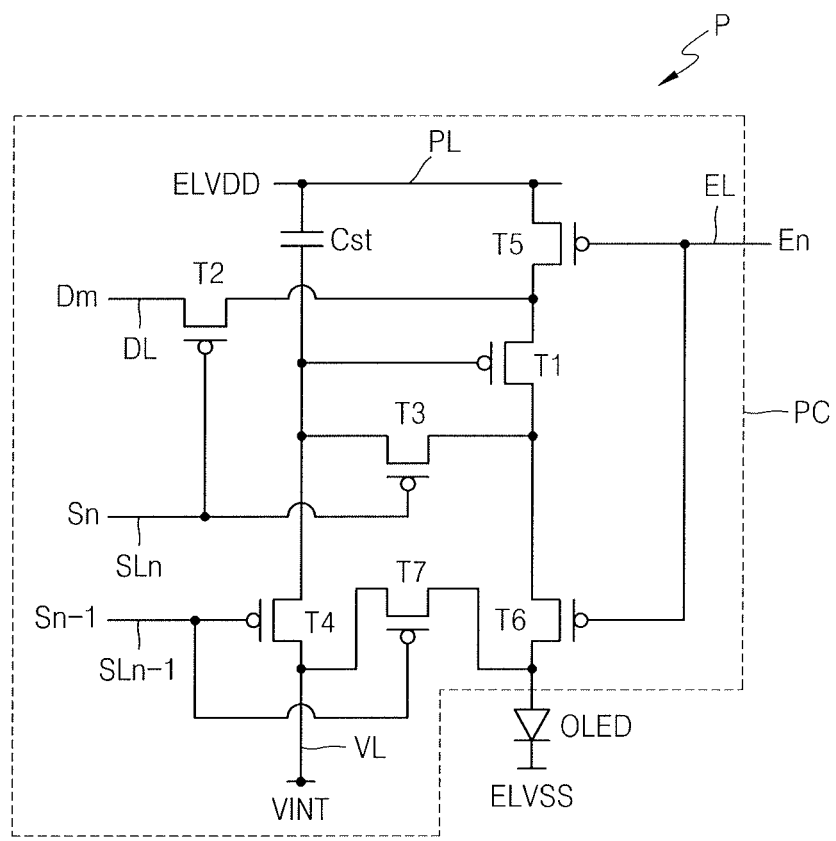

FIGS. 2A and 2B are equivalent circuit diagrams of any one pixel in a display device according to an embodiment.

Referring to FIG. 2A, each pixel P includes a pixel circuit PC connected to the scan line SL and the data line DL, and an organic light-emitting diode OLED connected to the pixel circuit PC.

The pixel circuit PC includes a driving TFT T1, a switching TFT T2, and a storage capacitor Cst. The switching TFT T2 is connected to the scan line SL and the data line DL, and supplies a data signal Dm input through the data line DL according to the scan signal Sn to the driving TFT T1.

The storage capacitor Cst is connected to the switching TFT T2 and the driving voltage line PL, and stores a voltage corresponding to a difference between a voltage supplied from the switching TFT T2 and the first power supply voltage ELVD (or driving voltage) supplied to the driving voltage line PL.

The driving TFT T1 is connected to the driving voltage line PL and the storage capacitor Cst, and may control a driving current flowing in the organic light-emitting device OLED from the driving voltage line PL corresponding to a voltage value stored in the storage capacitor Cst. The organic light-emitting device OLED may emit light having predetermined luminance according to the driving current.

Referring to FIG. 2B, the pixel circuit PC may include the driving and switching TFTs T1 and T2, a compensation TFT T3, a first initialization TFT T4, a first emission control TFT T5, a second emission control TFT T6, and a second initialization TFT T7.

FIG. 2B shows a case where signal lines SLn, SLn-1, EL, and DL, an initialization voltage line VL, and the driving voltage line PL are provided for each pixel. Alternatively, at least one of the signal lines SLn, SLn-1, EL, and DL, and/or the initialization voltage line VL may be shared by neighboring pixels.

A drain electrode of the driving TFT T1 may be electrically connected to the organic light-emitting device OLED via the second emission control TFT T6. The driving TFT T1 receives the data signal Dm according to a switching operation of the switching TFT T2 and supplies a driving current to the organic light-emitting device OLED.

A gate electrode of the switching TFT T2 is connected to a first scan line SL and a source electrode thereof is connected to the data line DL. A drain electrode of the switching TFT T2 may be connected to a source electrode of the driving TFT T1 and may further be connected to the driving voltage line PL via the first emission control TFT T5. The switching TFT T2 is turned on in response to a first scan signal Sn received through the first scan line SL and performs a switching operation for transmitting the data signal Dm transmitted to the data line DL to the source electrode of the driving TFT T1.

A gate electrode of the compensation TFT T3 may be connected to the first scan line SLn. A source electrode of the compensation TFT T3 may be connected to the drain electrode of the driving TFT T1 and may further be connected to a pixel electrode of the organic light-emitting device OLED via the second emission control TFT T6. A drain electrode of the compensation TFT T3 may be connected to any one electrode of the storage capacitor Cst, a source electrode of the first initialization TFT 14, and the gate electrode of the driving TFT T1. The compensation TFT T3 is turned on in response to the first scan signal Sn received through the first scan line SL to connect the gate electrode and the drain electrode of the driving TFT T1 to each other, thereby diode-connecting the driving TFT T1.

A gate electrode of the first initialization TFT T4 may be connected to the second scan line SLn-1 (previous scan line). A drain electrode of the first initialization TFT T4 may be connected to the initialization voltage line VL. The source electrode of the first initialization TFT T4 may be connected together to any one electrode of the storage capacitor Cst, the drain electrode of the compensation TFT T3, and the gate electrode of the driving TFT T1. The first initialization TFT T4 may be turned on in response to a second scan signal Sn-1 received through the second scan line SLn-1 to transmit an initialization voltage VINT to the gate electrode of the driving TFT T1 to perform an initialization operation for initializing a voltage of the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 may be connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT 13. A drain electrode of the second emission control TFT T6 may be electrically connected to the pixel electrode of the organic light-emitting device OLED. The first emission control TFT T5 and the second emission control TFT T6 are simultaneously turned on in response to the emission control signal En received through an emission control line EL so that the first power supply voltage ELVDD is transmitted to the organic light-emitting device OLED, and a driving current flows through the organic light-emitting device OLED.

A gate electrode of the second initialization TFT T7 may be connected to the second scan line SLn-1. A source electrode of the second initialization TFT T7 may be connected to the pixel electrode of the organic light-emitting device OLED. A drain electrode of the second initialization TFT T7 may be connected to the initialization voltage line VL. The second initialization TFT T7 may be turned on in response to the second scan signal Sn-1 received through the second scan line SLn-1 to initialize the pixel electrode of the organic light-emitting device OLED.

FIG. 2B describes a case where the first initializing TFT T4 and the second initializing TFT T7 are connected to the second scan line SLn-1, the disclosure is not limited thereto. Alternatively, the first initialization TFT T4 may be connected to the second scan line SLn-1, which is the previous scan line, and driven according to the second scan signal Sn-1. The second initialization TFT T7 may be connected to a separate signal line (e.g., next scan line) and driven according to a signal transmitted to the corresponding scan line.

The other electrode of the storage capacitor Cst may be connected to the driving voltage line PL. Any one electrode of the storage capacitor Cst may be connected together to the gate electrode of the driving TFT T1, the drain electrode of the compensation TFT T3, and the source electrode of the first initialization TFT T4.

In both FIGS. 2A and 2B, an opposite electrode (e.g., a cathode) of the organic light-emitting device OLED is supplied with a second power supply voltage ELVSS (or a common power supply voltage). The organic light-emitting device OLED receives a driving current from the driving TFT T1 and emits light. While the pixel circuit PC in FIG. 2A has two TFTs and one storage capacitor and, in FIG. 2B, has seven TFTs and one storage capacitor, the number of TFTs and storage capacitors may vary.

Figure 3:
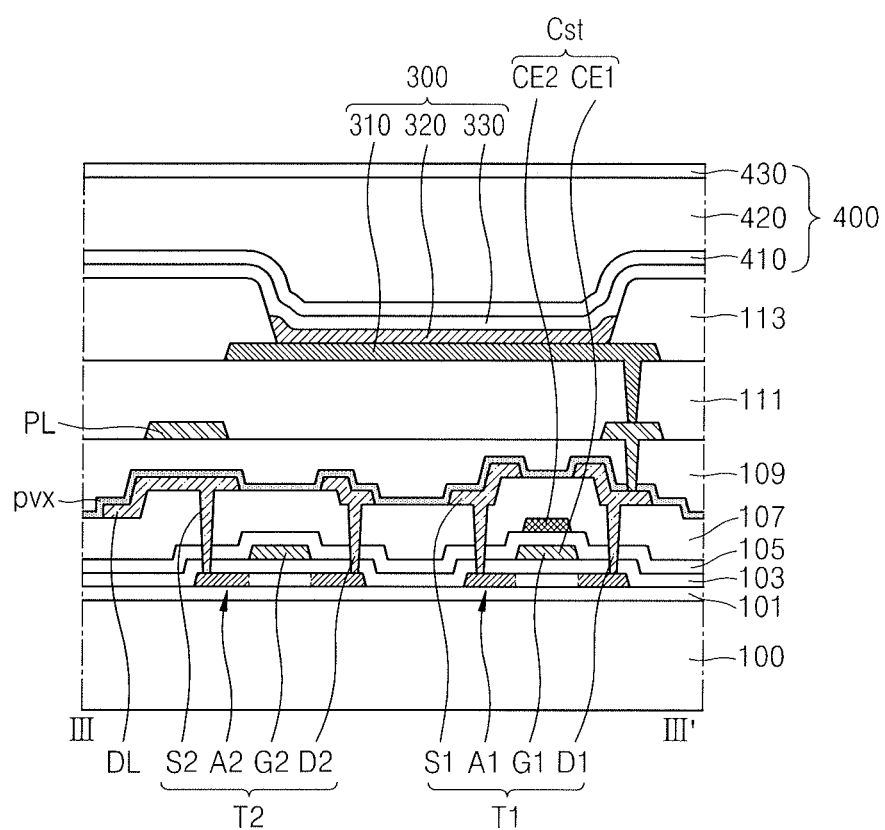
FIG. 3 illustrates a cross-sectional view of one pixel in a display device according to an embodiment, which corresponds to a line of FIG. 1.

FIG. 3 is a cross-sectional view of one pixel in a display device according to an embodiment, which corresponds to a line of FIG. 1. FIG. 3 shows the first and second TFTs T1 and T2 and the storage capacitor Cst among the pixel circuit PC of each pixel P described with reference to FIGS. 2A and 2B. FIG. 3 will be described in the stacking order along a stacking direction for convenience of explanation.

Referring to FIG. 3, a buffer layer 101 is on the substrate 100, and the driving and switching TFTs T1 and T2, and the storage capacitor Cst are on the buffer layer 101.

The substrate 100 may include various materials, e.g., a glass material or a plastic material, e.g., polyethylene terephthalate (PET), polyethylene naphthalate (PEN), polyimide, and the like. When the substrate 100 includes a plastic material, the flexibility thereof may be further improved compared to using a glass material. The buffer layer 101, e.g., silicon oxide (SiOx) and/or silicon nitride (SiNx) and the like, may prevent penetration of impurities into the substrate 100.

The driving TFT T1 includes the driving semiconductor layer A1 and the driving gate electrode G1. The switching TFT T2 includes a switching semiconductor layer A2 and a switching gate electrode G2. A first gate insulating layer 103 is between the driving semiconductor layer A1 and the driving gate electrode G1, and between the switching semiconductor layer A2 and the switching gate electrode G2. The first gate insulating layer 103 may include an inorganic insulating material, e.g., SiOx, SiNx, silicon oxynitride (SiON), and the like.

The driving semiconductor layer A1 and the switching semiconductor layer A2 may include polysilicon. The driving semiconductor layer A1 includes a driving channel region that overlaps the driving gate electrode G1 along the stacking direction and not doped with impurities, and a driving source region and a driving drain region doped with impurities respectively on opposite sides of the driving channel region, e.g., opposite second directions. A driving source electrode S1 and the driving drain electrode D1 may be connected to the driving source region and the driving drain region, respectively.

The switching semiconductor layer A2 may include a switching channel region that overlap the switching gate electrode G2 along the stacking direction and not doped with impurities, and a switching source region and a switching drain region doped with impurities respectively on opposite sides of the switching channel region, e.g., opposite second directions. A switching source electrode S2 and a switching drain electrode D2 may be connected to the switching source region and the switching drain region, respectively.

Each of the driving and switching gate electrodes G1 and G2 may include molybdenum (Mo), aluminum (Al), copper (Cu), titanium (Ti), and the like, and may be formed as a single layer or a multilayer. For example, each of the driving and switching gate electrodes G1 and G2 may be a single layer of Mo.

In some embodiments, the storage capacitor Cst may overlap the driving TFT T1 along the stacking direction. In this case, an area of the storage capacitor Cst and the driving TFT T1 may be increased and a high quality image may be provided. For example, the driving gate electrode G1 may be a first storage capacitor plate CE1 of the storage capacitor Cst. A second storage capacitor plate CE2 may overlap the first storage capacitor plate CE1 along the stacking direction with a second gate insulating layer 105 therebetween. The second gate insulating layer 105 may include an inorganic insulating material such as SiOx, SiNx, and SiON.

The driving and switching TFTs T1 and T2, and the storage capacitor Cst may be covered with an interlayer insulating layer 107. The interlayer insulating layer 107 may be an inorganic layer, e.g., SiON, SiOx, SiNx, and the like. The data line DL is on the interlayer insulating layer 107 and is connected to the switching semiconductor layer A2 of the switching TFT T2 through a contact hole in the interlayer insulating layer 107. The data line DL may serve as the switching source electrode S2. The driving source electrode S1, the driving drain electrode D1, the switching source electrode S2, and the switching drain electrode D2 may be on the interlayer insulating layer 107, and may be connected to the driving semiconductor layer A1 or the switching semiconductor layer A2 through contact holes in the interlayer insulating layer 107.

The data line DL, the driving source electrode S1, the driving drain electrode D1, the switching source electrode S2, and the switching drain electrode D2 may be covered with an inorganic protective layer PVX. The inorganic protective layer PVX may be a single layer or a multilayer of SiNx and SiOx. The inorganic protective layer PVX may cover and protect some of wirings exposed in the non-display area NDA. Wirings formed in the same operation as the data line DL may be exposed in a portion of the substrate 100 (e.g., a portion of the non-display area NDA). The exposed portion of the wirings may be damaged by an etchant used in patterning a pixel electrode 310. Since the inorganic protective layer PVX covers the data line DL and at least a portion of the wirings formed together with the data line DL, the wirings may be prevented from being damaged in the patterning process of the pixel electrode 310.

The driving voltage line PL may be on a different layer from the data line DL. Herein, "A and B are arranged in different layers" indicates that at least one insulating layer is between A and B so that one of A and B is under the at least one insulating layer and the other is on the at least one insulating layer. The inorganic protective layer PVX and a via layer 109 may be between the driving voltage line PL and the data line DL, e.g., the driving voltage line PL may be on the via layer 109, and the via layer 109 having the driving voltage line PL thereon may be covered with an organic insulating layer 111.

The driving voltage line PL may be a single layer or a multilayer including at least one of e.g., Al, Cu, Ti, alloys thereof, and the like. In an embodiment, the driving voltage line PL may be a three-layer structure of Ti/Al/Ti. FIG. 3 shows a configuration in which the driving voltage line PL is only on the via layer 109. Alternatively, the driving voltage line PL may be connected to a lower additional voltage line formed in the same layer as the data line DL through a through hole formed in the via layer 109 to reduce resistance.

The via layer 109 and the organic insulating layer 111 are planarization insulating layers, and may include organic materials. The organic materials may include a general polymer, e.g., polymethylmethacrylate (PMMA) or polystyrene (PS), a polymer derivative including a phenolic group, an acrylic polymer, an aryl ether polymer, an amide polymer, a fluorine-based polymer, a p-xylene-based polymer, a vinyl alcohol polymer, or a blend thereof. The via layer 109 may include an organic material, and a specific material thereof is as described above. Alternatively, the via layer 109 may include an inorganic material such as SiON, SiOx, and/or SiNx.

A display element 300 may be located on the organic insulating layer 111. The display element 300 may include the pixel electrode 310, an opposite electrode 330, and an intermediate layer 320 therebetween that includes an emission layer.

A pixel defining layer 113 may be on the pixel electrode 310. The pixel defining layer 113 defines a pixel by having an opening exposing the pixel electrode 310. In addition, the pixel defining layer 113 may increase a distance between an edge of the pixel electrode 310 and the opposite electrode 330, thereby preventing generation of an arc or the like therebetween. The pixel defining layer 113 may include an organic material, e.g., polyimide, hexamethyldisiloxane (HMDSO), and the like.

The intermediate layer 320 may include a low molecular weight material or a polymer material. When the intermediate layer 320 includes a low molecular weight material, the intermediate layer 320 may have a single-layer or multi-layered structure by stacking a hole injection layer (HIL), a hole transport layer (HTL), an emission layer (EML), an electron transport layer (ETL), and an electron injection layer (EIL). The intermediate layer 320 may include various organic materials, such as copper phthalocyanine (CuPc), N,N'-Di(naphthalene-1-yl)-N,N'-diphenyl-benzidine (NPB), and tris-8-hydroxyquinoline aluminum (Alq3). The layers may be formed by an evaporation method.

When the intermediate layer 320 includes a polymer material, the intermediate layer 320 may have a structure including an HTL and an EML. The HTL may include poly(3,4-ethylenedioxythiophene) (poly(ethylenedioxythiophene)) and the EML may include a polymer material, such as poly-phenylenevinylene (PPV) and polyfluorene. Alternatively, the intermediate layer 320 may include an integral layer over all the plurality of the pixel electrodes 310 or may have layers patterned to correspond to each of the pixel electrodes 310.

The opposite electrode 330 may be formed over the display area DA to cover the display area DA. The opposite electrode 330 may be integrally formed over a plurality of organic light-emitting devices OLEDs to correspond to the plurality of the pixel electrodes 310.

Since the organic light-emitting device OLED is easily damaged by moisture or oxygen from the outside, the thin-film encapsulation layer 400 may cover and protect the organic light-emitting device OLED. The thin-film encapsulation layer 400 may cover the display area DA and extend to the outside of the display area DA. The thin-film encapsulation layer 400 may include at least one organic encapsulation layer and at least one inorganic encapsulation layer. For example, the thin-film encapsulation layer 400 may include a first inorganic encapsulation layer 410, the organic encapsulation layer 420, and a second inorganic encapsulation layer 430.

The first inorganic encapsulation layer 410 covers the opposite electrode 330 and may include SiOx, SiNx, and/or SiON. Other layers, e.g., a capping layer, and the like, may be between the first inorganic encapsulation layer 410 and the opposite electrode 330. A shape of the first inorganic encapsulation layer 410 may be conformal to the shape of a structure therebelow, and thus, an upper surface thereof is not flat. The organic encapsulation layer 420 covers the first inorganic encapsulation layer 410. However, unlike the first inorganic encapsulation layer 410, an upper surface of the organic encapsulation layer 420 may be formed generally flat. In more detail, the upper surface of the organic encapsulation layer 420 corresponding to the display area DA may be approximately flat. The organic encapsulation layer 420 may include at least one of, e.g., PET, PEN, polycarbonate (PC), polyimide (PI), polyethersulphone (PES), polyoxymethylene (POM), polyacrylate (PAR), HMDSO, and the like. The second inorganic encapsulation layer 430 covers the organic encapsulation layer 420 and may include SiOx SiNx, and/or SiON, and the like.

Even if a crack occurs in the thin-film encapsulation layer 400 through the above-described multilayer structure, the crack may not extend between the first inorganic encapsulation layer 410 and the organic encapsulation layer 420, or between the organic encapsulation layer 420 and the second inorganic encapsulation layer 430. Thus, formation of a penetration path of external moisture or oxygen into the display area DA may be prevented or minimized. A polarizing plate may attached to the thin-film encapsulation layer 400 using a transparent adhesive. The polarizing plate may reduce external light reflection. Alternatively, a layer including a black matrix and a color filter may be used.

Figure 4:
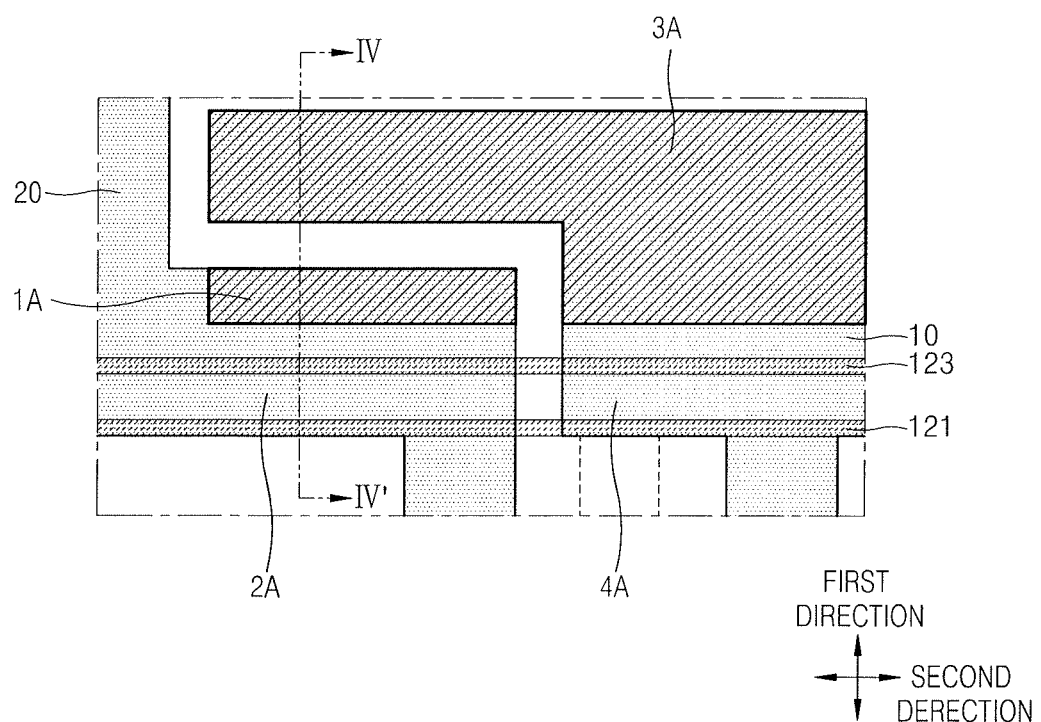
FIG. 4 illustrates an enlarged plan view of portion A of FIG. 1.
Figure 5:
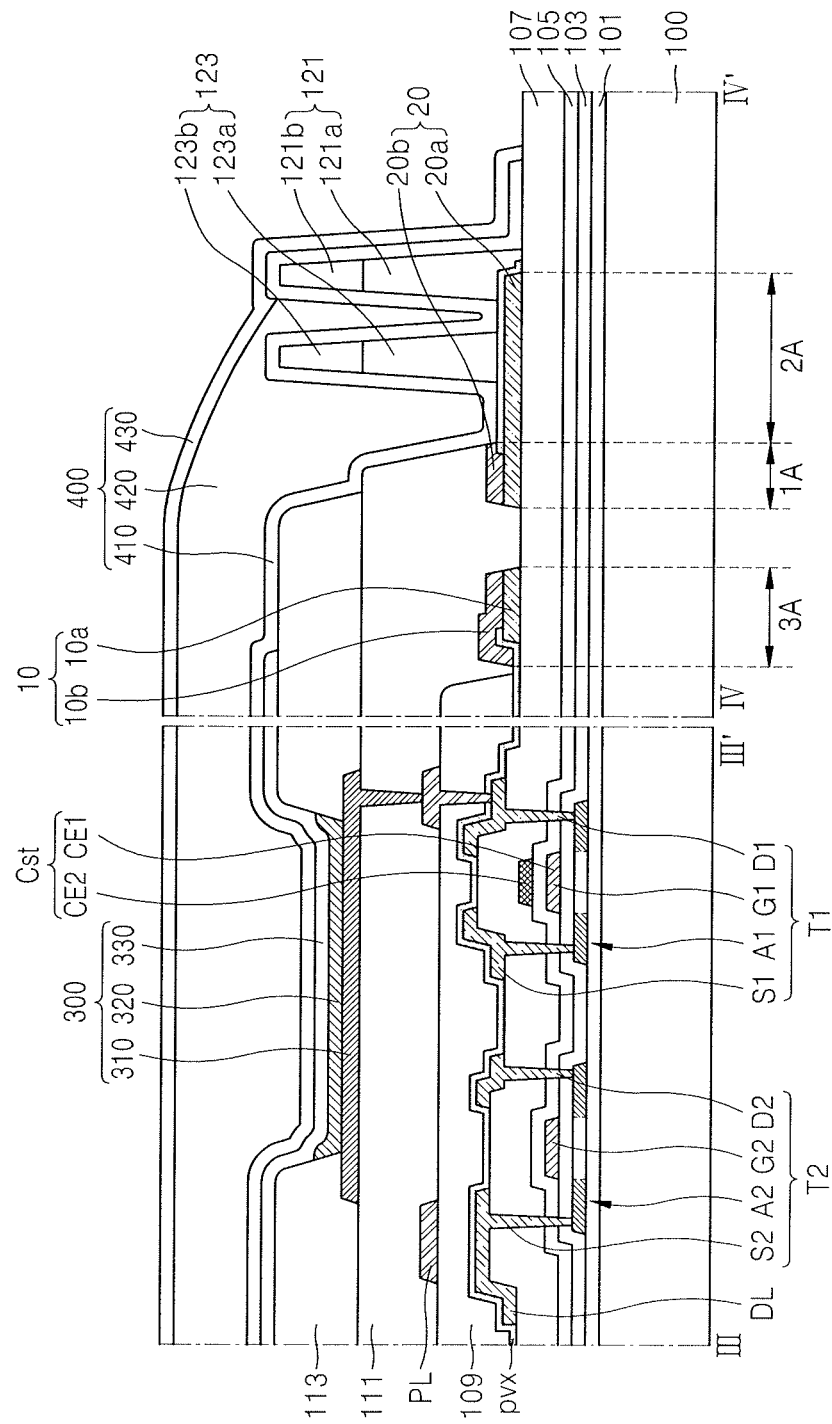
FIG. 5 illustrates a cross-sectional view taken along a line of FIG. 1 and a line IV-IV' of FIG. 4.

FIG. 4 is an enlarged plan view of portion A of FIG. 1, which corresponds to a portion between the display area DA and the pad portion 30. FIG. 5 is a cross-sectional view taken along a line IV-IV' of FIG. 4, like the cross-sectional view of FIG. 3.

Referring to FIGS. 4 and 5, the second power supply voltage line 20 includes a first region 1A and a second region 2A, and the first power supply voltage line 10 includes a third region 3A and a fourth region 4A. Each of the first region 1A and the third region 3A may have a structure in which a first conductive layer and a second conductive layer are stacked along the stacking direction, and each of the second region 2A and the fourth region 4A may have a structure including the first conductive layer. Each of the first region 1A and the third region 3A may be a region covered by the organic insulating layer 111 extending from the display area DA, and each of the second region 2A and the fourth region 4A may be an area covered by the inorganic protective layer PVX.

Further, sides of the first region 1A and the third region 3A furthest from the display area DA along the first direction towards the pad portion 30 may substantially coincide. Additionally, along the first direction towards the pad portion 30, sides of the second region 2A and the fourth region 4A furthest from the display area DA may substantially coincide.

For example, the first region 1A of the second power supply voltage line 20 may include a structure in which a first conductive layer 20a, a second conductive layer 20b, and the organic insulating layer 111 are stacked, and the second region 2A may include a structure in which the first conductive layer 20a and the inorganic protective layer PVX are stacked.

The third region 3A of the first power supply voltage line 10 may include a structure in which a first conductive layer 10a, the second conductive layer 10b, and the organic insulating layer 111 are stacked, and the fourth region 4A may include a structure in which the first conductive layer 10a and the inorganic protective layer PVX are stacked. The fourth region 4A may have a cross-section that looks like that of the second region 2A, but includes the first conductive layer 10a extending from the third region 3A.

The first conductive layers 10a and 20a may include the same material as the data line DL, or the source electrodes S1 and S2 and the drain electrodes D1 and D2 of the driving and switching TFTs T1 and T2. The second conductive layers 10b and 20b may include the same material as the driving voltage line PL. In some other embodiments, the first conductive layers 10a and 20a and the second conductive layer 10b and 20b may include an identical material. For example, the first and second conductive layers 10a, 20a, 10b, and 20b may be formed of Ti/Al/Ti. In the first region 1A and the third region 3A, the second conductive layers 10b and 20b may directly contact the first conductive layers 10a and 20a.

When widths of the first power supply voltage line 10 and the second power supply voltage line 20 are decreased to reduce the non-display area NDA, a resistance value of the first and second power supply voltage lines 10 and 20 may increase. In the present embodiment, the first region 1A and/or the third region 3A in which the first conductive layer and the second conductive layer are stacked, e.g., in direct contact, are introduced to minimize the resistance value of the power supply voltage lines.

Meanwhile, in the present embodiment, since the first and second power supply voltage lines 10 and 20 may be damaged by an etchant used when the pixel electrode 310 is patterned so that the first and second power supply voltage lines 10 and 20 are covered with an insulating layer and protected before the pixel electrode 310 is formed.

That is, the third region 3A of the first power supply voltage line 10 and the first region 1A of the second power supply voltage line 20 are covered by the organic insulating layer 111 extending from the display area DA, and the fourth region 4A of the first power supply voltage line 10 and the second region 2A of the second power supply voltage line 20 are covered with the inorganic protective layer PVX.

Since the organic insulating layer 111 may include an organic material, if the organic insulating layer 111 extends to the second region 2A and the fourth region 4A and connected to the dam portion 120 including an organic material, the organic insulating layer 111 may be vulnerable to permeation of outside air or moisture. In the present embodiment, since the organic insulating layer 111 and the dam portion 120 are spaced apart from each other and the inorganic protective layer PVX is between the organic insulating layer 111 and the dam portion 120, penetration of outside air or moisture into the display area DA may be reduced or prevented.

Meanwhile, the pixel defining layer 113 extending from the display area DA may be above the first region 1A and the third region 3A. The first region 1A and the third region 3A may be covered by the organic insulating layer 111 and the pixel defining layer 113. In particular, along the stacking direction, the organic insulating layer 111 may fully overlap both of the first region and the third region 3A, while the pixel defining layer 113 may fully overlap the third region 3A and partially overlap the first region 1A.

The dam portion 120 may include the first dam 121 and the second dam 123. The dam portion 120 is spaced apart from the organic insulating layer 111 and the pixel defining layer 113. When the organic encapsulation layer 420 of the thin-film encapsulation layer 400 is formed, it is possible to prevent organic materials from flowing to an edge of the substrate 100. When a plurality of dam portions 120 are provided, a plurality of dams may be arranged apart from each other. For example, the first dam 121 and the second dam 123 may be arranged apart from each other.

The first dam 121 and the second dam 123 may have a single-layer or multi-layered structure. As shown in the drawings, the first dam 121 and the second dam 123 may have a structure in which first layers 121a and 123a and second layers 121b and 123b are stacked. In this case, the first layers 121a and 123a may be formed of the same material as the organic insulating layer 111, and the second layers 121b and 123b may be formed of the same material as the pixel defining layer 113 at the same time. Alternatively, the first dam 121 and/or the second dam 123 may have a single-layer or multi-layered structure and various modifications may be made.

Since the first inorganic encapsulation layer 410 and the second inorganic encapsulation layer 430 of the thin-film encapsulation layer 400 are directly brought into contact with the outside of the first dam 121, the organic encapsulation layer 420 may not be exposed to the outside. In other words, while the organic encapsulation layer 420 may extend between the first and second dams 123 and 121, surfaces of the second dam 121 exposed to the outside, e.g., an upper surface and an outer sidewall thereof, may be provided with the first inorganic encapsulation layer 410 and the second inorganic encapsulation layer 430 in contact with each other directly thereon. Thus, permeation of outside air or moisture by organic materials may be reduced or prevented.

Figure 6:
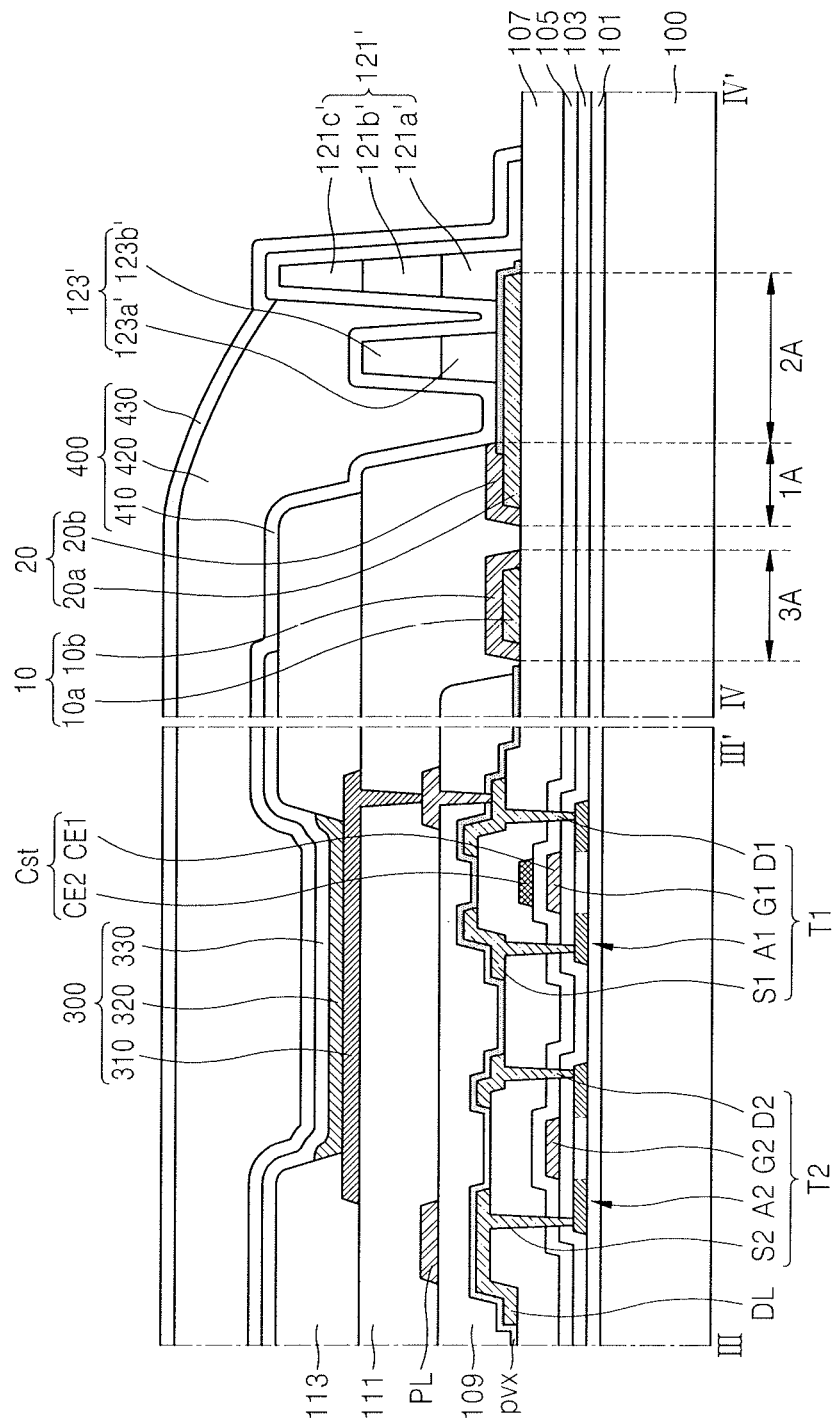
FIG. 6 illustrates a cross-sectional view of a portion of a display device according to another embodiment.

FIG. 6 is a cross-sectional view of a portion of a display device according to another embodiment. In FIG. 6, the same reference numerals in FIG. 5 denote the same elements, and a duplicate description thereof will not be given herein.

Referring to FIG. 6, the third region 3A of the first power supply voltage line 10 includes a structure in which the first conductive layer 10a and the second conductive layer 10b are stacked, and the first region 1A of the second power supply voltage line 20 includes a structure in which the first conductive layer 20a and the second conductive layer 20b are stacked. In the present embodiment, the second conductive layers 10b and 20b may cover a side surface of at least one end of the first conductive layers 10a and 20a. One end of the second conductive layers 10b and 20b that extends beyond the ends of the first conductive layers 10a and 20a may directly contact a layer (e.g., the interlayer insulating layer 107) under the first conductive layers 10a and 20a.

When the second conductive layers 10b and 20b cover the end of the first conductive layers 10a and 20a, a contact area of the second conductive layers 10b and 20b with the second conductive layers 10b and 20b increases, reducing resistance of the power supply voltage line. Therefore, the first conductive layers 10a and 20a may be prevented from being damaged when the second conductive layers 10b and 20b are patterned. For example, when the second conductive layers 10b and 20b are patterned so as to be located only on upper surfaces of the first conductive layers 10a and 20a, the first conductive layers 10a and 20a may be damaged by gas used for etching, e.g., dry etching, the second conductive layers 10b and 20b. However, this problem may be avoided when the second conductive layers 10b and 20b cover the ends of the first conductive layers 10a and 20a.

The first region 1A of the second power supply voltage line 20 may be covered by the organic insulating layer 111, and the pixel defining layer 113 extending from the display area DA and the second region 2A may be covered by the inorganic protective layer PVX. Since the organic insulating layer 111 and the dam portion 120 are spaced apart from each other and a portion of the inorganic protective layer PVX is between the organic insulating layer 111 and the dam portion 120, permeation of outside air through organic materials may be prevented.

The dam portion 120 may include a first dam 121' and a second dam 123'. In the present embodiment, the height of the first dam 121 adjacent to an edge of the substrate 100 may be greater than the height of the second dam 123 adjacent to the display area DA.

In some embodiments, the first dam 121' may include a first layer 121a', a second layer 121b', and a third layer 121c', and the second dam 123' may include a first layer 123a' and a second layer 123b'. In this case, the first layers 121a' and 123a' may include the same material as the via layer 109, the second layers 121b' and 123b' may include the same material as the organic insulating layer 111, and the third layer 121c' may include the same material as the pixel defining layer 113. Alternatively, the first dam 121 may have a two-layer structure, the second dam 123 may have a one-layer structure, and various modifications may be made.

Figure 7:
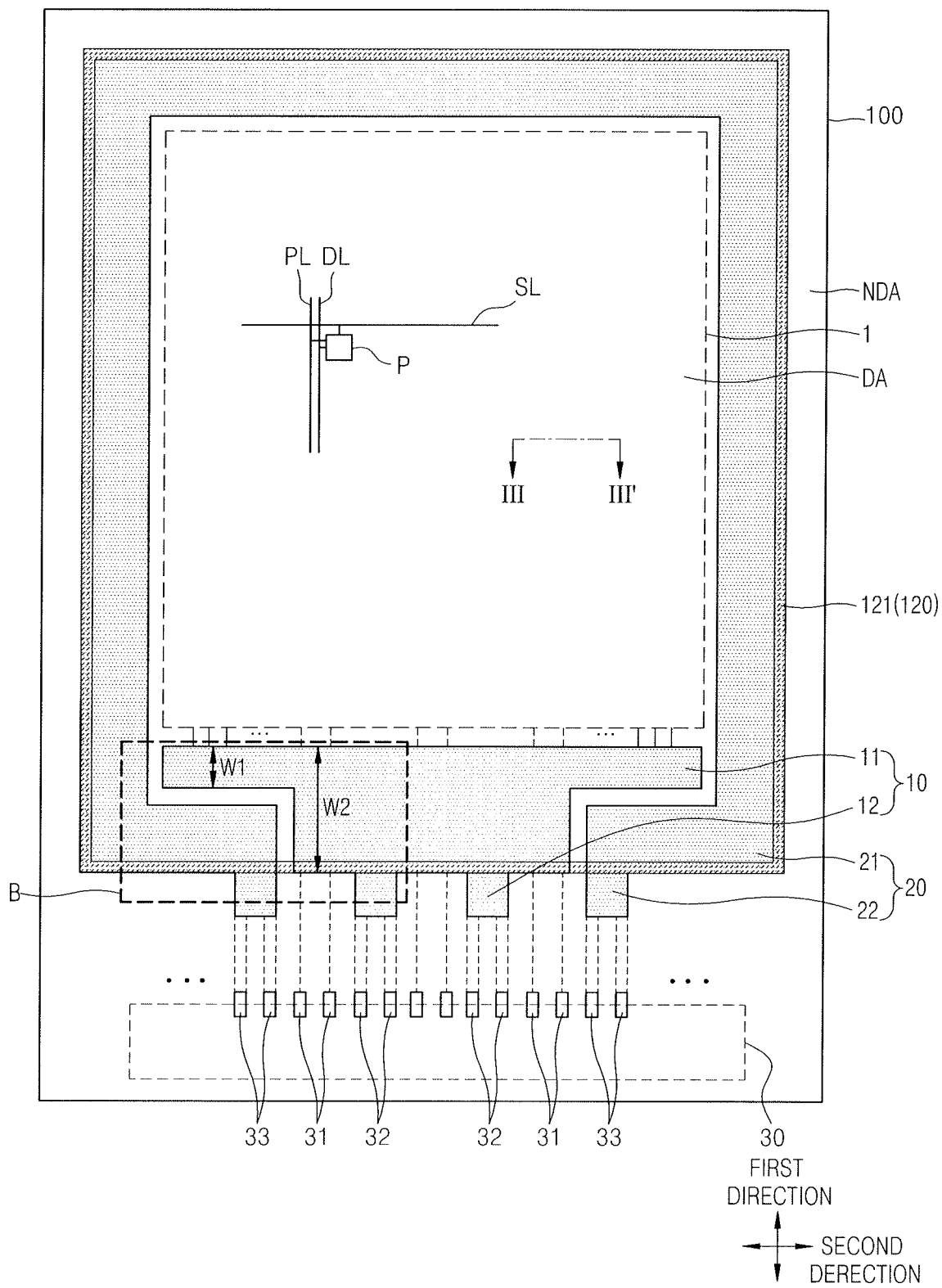
FIG. 7 illustrates a plan view of a display device according to another embodiment.
Figure 8:
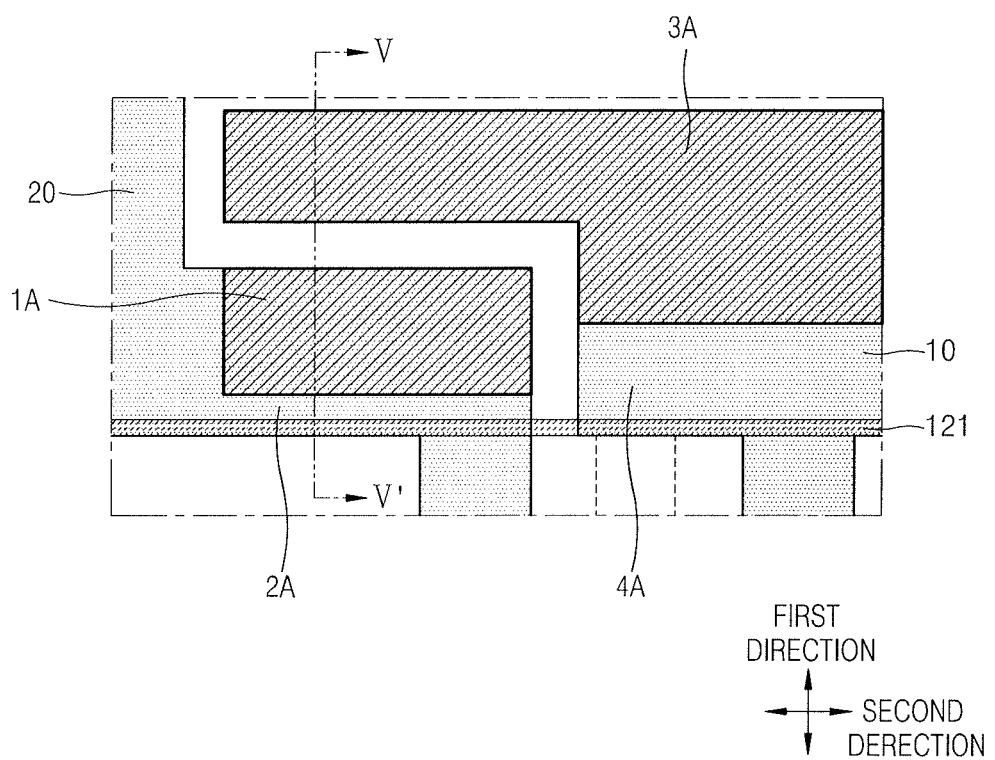
FIG. 8 illustrates an enlarged plan view of portion B of FIG. 7.
Figure 9:
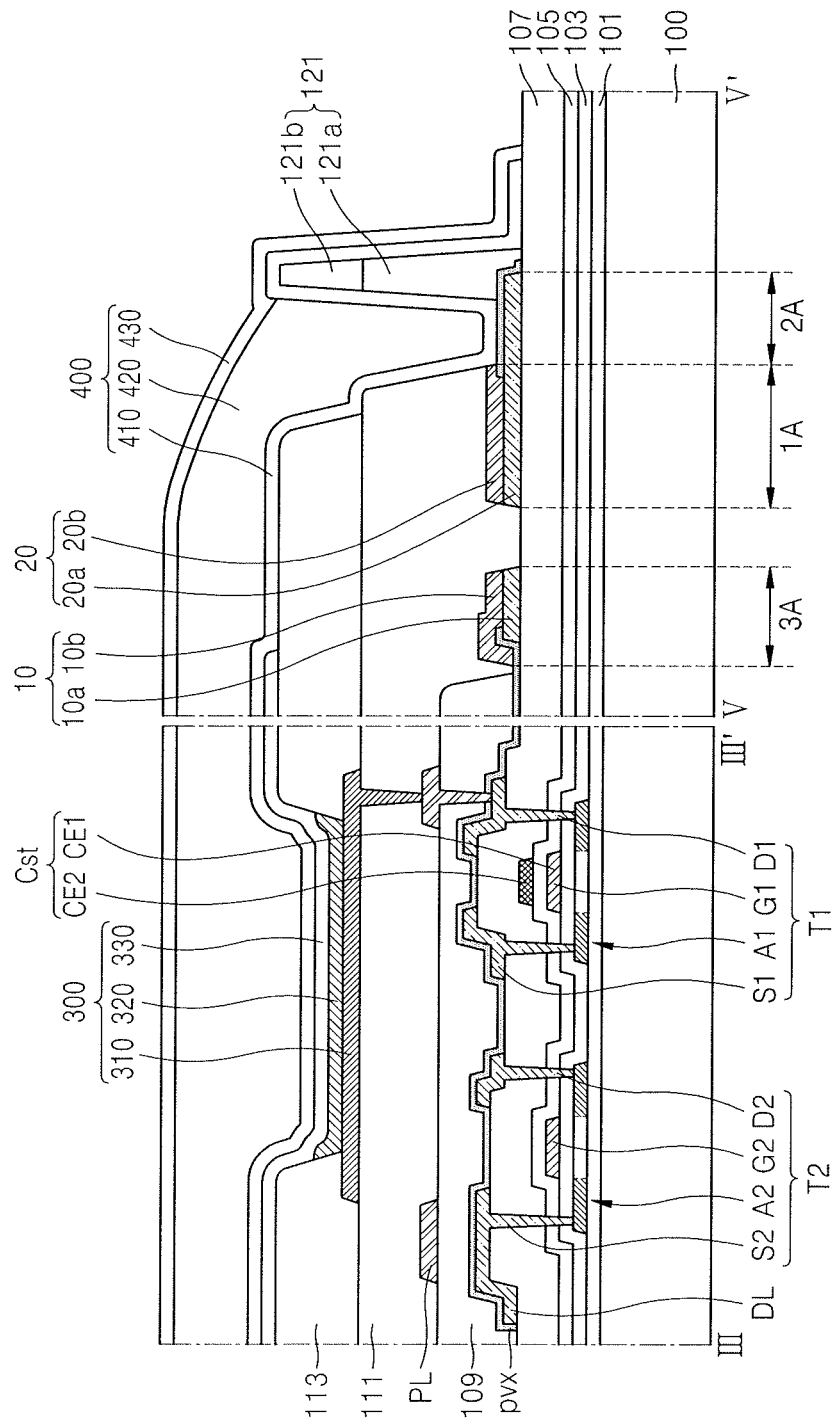
FIG. 9 illustrates a cross-sectional view taken along a line of FIG. 7 and a line V-V' of FIG. 8.

FIG. 7 is a plan view of a display device according to another embodiment, FIG. 8 is an enlarged plan view of portion B of FIG. 7, and FIG. 9 is a cross-sectional view taken along a line of FIG. 7 and a line V-V' of FIG. 8. In FIGS. 7 to 9, the same reference numerals as in FIGS. 1 to 5 denote the same elements, and a duplicate description thereof will not be given herein.

Referring to FIGS. 7 to 9, the first and second power supply voltage lines 10 and 20 are in a non-display area of the display device and are spaced apart from each other. The first power supply voltage line 10 may transmit the first power supply voltage ELVDD or a driving voltage and the second power supply voltage line 20 may transmit the second power supply voltage ELVSS or a common voltage.

The first power supply voltage line 10 may include the first main voltage line 11 and the first connection line 12 arranged to correspond to one side of the display area DA. The first main voltage line 11 may have an end portion having the first width W1 in the first direction and a central portion having the second width W2 in the first direction, the second width W2 being greater than the first width W1. The first connection line 12 may extend from the first main voltage line 11 in the first direction and may be connected to the first pad 32 of the pad portion 30.

The second power supply voltage line 20 may include the second main voltage line 21 partially surrounding both end portions of the first main voltage line 11 and the display area DA and the second connection line 22 extending from the second main voltage line 21 in the first direction. The second connection line 22 extends in the first direction parallel to the first connection line 12 and is connected to the pad portion 30, e.g., the second pad 33.

Both end portions of the first power supply voltage line 10 have the width W1 less than the width W2 of the central portion of the first power supply voltage line 10 so that the second power supply voltage line 20 may not occupy much space in surrounding the both end portions of the first power supply voltage line 10. In addition, since the central portion of the first power supply voltage line 10 has the relatively large width W2, the overall resistance of the first power supply voltage line 10 may be small.

In the present embodiment, the dam portion 120 may include only the first dam 121 of the second power supply voltage line 20. The first dam 121 is arranged apart from the organic insulating layer 111 and the pixel defining layer 113. When the organic encapsulation layer 420 of the thin-film encapsulation layer 400 is formed, it is possible to prevent organic materials from flowing to the edge of the substrate 100. The first dam 121 may be formed to cover an outer edge of the second power supply voltage line 20.

As shown in FIG. 8, when the dam portion 120 includes only the first dam 121, the first region 1A of the second power supply voltage line 20 may extend in the first direction (pad portion direction) and the second direction so that resistance of the second power supply voltage line 20 may be further reduced.

In some embodiments, a closest side of the first region 1A may be closer to pad portion 30 along the first direction than a closest side of the third region 3A. In other words, along the first direction towards the pad portion 30, a side of the first region 1A furthest from the display region DA may be further from the display area DA than a furthest side of the third region 3A. Alternatively, the third region 3A of the first power supply voltage line 10 may be enlarged in the first direction and various modifications may be made.

The second power supply voltage line 20 may include the first region 1A and the second region 2A. The first region 1A may have a stack of the first conductive layer 20a, the second conductive layer 20b, and the organic insulating layer 111, and the second region 2A may have a stack of the first conductive layer 20a and the inorganic protective layer PVX.

The first power supply voltage line 10 may include the third region 3A and the fourth region 4A. The third region 3A may have a stack of the first conductive layer 10a, the second conductive layer 10b, and the organic insulating layer 111, and the fourth region 4A may have a stack of the first conductive layer 10a and the inorganic protective layer PVX.

Since the first region 1A and the third region 3A have a multilayer structure of the first conductive layers 10a and 20a and the second conductive layers 10b and 20b, the resistances of the first and second power supply voltage lines 10 and 20 may be reduced.

The organic insulating layer 111 is between the driving and switching thin film transistors T1 and T2, and the display element 300 in the display area DA, and extends to the non-display area NDA. The organic insulating layer 111 may be arranged in the first region 1A and the third region 3A to protect a portion of the first and second power supply voltage lines 10 and 20.

Remaining portions of the first and second power supply voltage lines 10 and 20, e.g., the second region 2A and the fourth region 4A may be protected by the inorganic protective layer PVX. Accordingly, the first and second power supply voltage lines 10 and 20 may not be damaged by an etchant used for patterning the pixel electrode 310.

Meanwhile, since the organic insulating layer 111 and the first dam 121 are spaced apart from each other, and the first and second power supply voltage lines 10 and 20 therebetween are protected by the inorganic protective layer PVX formed of inorganic materials, permeation of outside air through organic materials may be prevented.

Embodiments of the disclosure may implement a display device that provides a high-quality image through a power supply voltage line that minimizes voltage drop and damage, while decreasing a non-display area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a substrate including a display area to display an image and a non-display area outside the display area;
a thin-film transistor on the display area;
a display element electrically connected to the thin-film transistor;
an organic insulating layer between the thin-film transistor and the display element in the display area and extending to a portion of the non-display area;
a first power supply voltage line arranged on one side of the display area in the non-display area;
a second power supply voltage line and spaced apart from the first power supply voltage line in the non-display area; and
an inorganic protective layer that covers at least a portion of the second power supply voltage line, wherein
the second power supply voltage line includes a first region and a second region,
the first region has a stack of a first conductive layer, a second conductive layer, and the organic insulating layer,
the second region has a stack of the first conductive layer and the inorganic protective layer, and
wherein the inorganic protective layer is on top of the first conductive layer, and the second conductive layer is on top of the inorganic protective layer.
2. The display device as claimed in claim 1, further comprising a data line and a driving voltage line arranged in the display area, the data line and the driving voltage line electrically connected to the thin-film transistor and provided in different layers, wherein the display element includes a pixel electrode, an opposite electrode facing the pixel electrode, and an intermediate layer between the pixel electrode and the opposite electrode, the first conductive layer is of a same material layer as the data line, the second conductive layer is of a same material layer as the driving voltage line, and the organic insulating layer is between the driving voltage line and the pixel electrode.

3. The display device as claimed in claim 2, further comprising a pixel defining layer that covers an edge of the pixel electrode in the display area, wherein the pixel defining layer overlaps the first region in the non-display area.

4. The display device as claimed in claim 1, wherein:

the first power supply voltage line includes a third region and a fourth region, the third region is covered with the organic insulating layer, and the fourth region is covered with the inorganic protective layer.

5. The display device as claimed in claim 4, wherein a side of the first region furthest from the display area substantially coincides a side of the third region furthest from the display area.

6. The display device as claimed in claim 1, wherein:

the first power supply voltage line includes end portions having a first width and a central portion having a second width greater than the first width, and the second power supply voltage line bends to surround the end portion of the first power supply voltage line.

7. The display device as claimed in claim 1, further comprising a pad portion corresponding to one edge of the substrate, wherein the first region of the second power supply voltage line is between the display area and the pad portion.

8. The display device as claimed in claim 1, wherein, in the first region, the second conductive layer covers a side surface of at least one end of the first conductive layer.

9. The display device as claimed in claim 1, further comprising:

a thin-film encapsulation layer on the display area; and a dam portion on the non-display area and surrounding at least a portion of the display area, wherein at least a portion of the dam portion is on the second power supply voltage line.

10. The display device as claimed in claim 9, wherein the dam portion is spaced apart from the organic insulating layer.

11. The display device as claimed in claim 9, wherein the inorganic protective layer is between the second power supply voltage line and the dam portion.

12. The display device as claimed in claim 9, wherein:

the dam portion includes a first dam and a second dam spaced from each other, the first dam covers an edge of the second power supply voltage line, and the second dam is closer to the display area than the first dam.

13. The display device as claimed in claim 12, wherein at least one of the first dam and the second dam includes in a plurality of layers.

14. A display device, comprising:

a substrate including a display area to display an image and a non-display area outside the display area;

a thin-film transistor on the display area;

a display element electrically connected to the thin-film transistor;

an organic insulating layer between the thin-film transistor and the display element in the display area, the organic insulating layer extending to a portion of the non-display area;

a pad portion on one side of the substrate in the non-display area;

a power supply voltage line between the display area and the pad portion; and an inorganic protective layer that covers at least a portion of the power supply voltage line, wherein the power supply voltage line includes a first region and a second region, the first region has a stack of a first conductive layer, a second conductive layer, and the organic insulating layer, the second region has a stack of the first conductive layer and the inorganic protective layer, and wherein the inorganic protective layer is on top of the first conductive layer, and the second conductive layer is on top of the inorganic protective layer.

15. The display device as claimed in claim 14, further comprising a data line and a driving voltage line electrically connected to the thin-film transistor and provided in different layers, wherein the first conductive layer is of a same material layer as the data line, the second conductive layer is of a same material layer as the driving voltage line, the organic insulating layer is on the driving voltage line, and a via layer is between the data line and the driving voltage line.

16. The display device as claimed in claim 14, further comprising:

a pixel electrode, an opposite electrode facing the pixel electrode, and an intermediate layer between the pixel electrode and the opposite electrode, and a pixel defining layer that covers an edge of the pixel electrode in the display area, wherein the pixel defining layer overlaps the first region in the non-display area.

17. The display device as claimed in claim 14, further comprising:

a thin-film encapsulation layer on the display area; and a dam portion on the non-display area and surrounding at least a portion of the display area, wherein at least a portion of the dam portion is on the power supply voltage line.

18. The display device as claimed in claim 17, wherein:

the thin-film encapsulation layer includes a first inorganic encapsulation layer, an organic encapsulation layer, and a second inorganic encapsulation layer, the organic encapsulation layer is inside the dam portion, and the first inorganic encapsulation layer and the second inorganic encapsulation layer are in contact with each other outside the dam portion.

19. The display device as claimed in claim 17, wherein the dam portion is spaced apart from the organic insulating layer.

20. The display device as claimed in claim 17, wherein the inorganic protective layer is between the dam portion and the power supply voltage line.

* * * * *